United States Patent
Wang et al.

(10) Patent No.: US 6,291,331 B1
(45) Date of Patent: Sep. 18, 2001

(54) RE-DEPOSITION HIGH COMPRESSIVE STRESS PECVD OXIDE FILM AFTER IMD CMP PROCESS TO SOLVE MORE THAN 5 METAL STACK VIA PROCESS IMD CRACK ISSUE

(75) Inventors: Ying-Lang Wang, Tai-Chung County; Jowei Dun, Hsin-Chu; Ming-Jer Lee; Tong-Hua Kuan, both of Hsinchu, all of (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/412,654

(22) Filed: Oct. 4, 1999

(51) Int. Cl.$^7$ .................................................. H01L 21/44
(52) U.S. Cl. ........................ 438/618; 438/622; 438/624; 438/633
(58) Field of Search .................................. 438/618, 597, 438/622, 624, 631, 633

(56) References Cited

U.S. PATENT DOCUMENTS

| | | | |
|---|---|---|---|
| 5,739,579 | 4/1998 | Chiang et al. | 257/635 |
| 5,741,626 | 4/1998 | Jain et al. | 430/314 |
| 5,807,785 | * 9/1998 | Ravi . | |
| 5,814,377 | 9/1998 | Robles et al. | 427/579 |
| 5,891,799 | * 4/1999 | Tsui . | |

* cited by examiner

Primary Examiner—Kevin M. Picardat
Assistant Examiner—D. M. Collins
(74) Attorney, Agent, or Firm—George O. Saile; Stephen B. Ackerman

(57) ABSTRACT

A new method is provided for the creation of layers of dielectric that are used for metal stack interconnect layers where the metal stack exceeds five layers. A stack of five layers of metal interconnect lines contains one layer of Intra Metal dielectric (ILD) and four layers of Inter Metal dielectric (IMD). One or more of the layers of IMD can be formed in the conventional method. One or more of the layers of IMD can be formed in the conventional method after which a layer of high compressive PECVD is deposited over this one or more layers of IMD. The layer of high compressive PECVD provides a crack resistant film that eliminates the formation of cracks in the surface of the IMD.

21 Claims, 2 Drawing Sheets

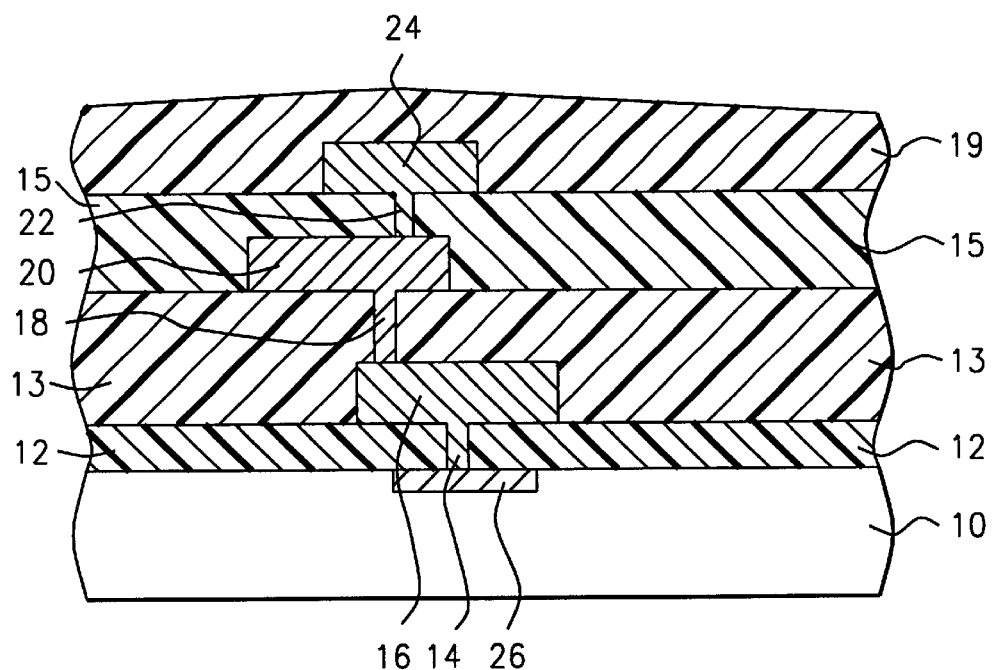
FIG. 1 – Prior Art
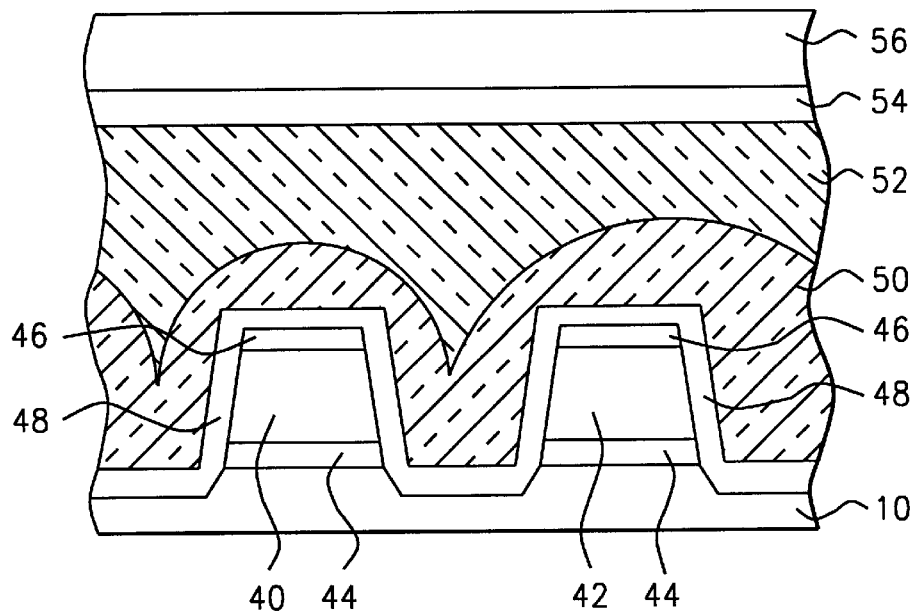
FIG. 2

RE-DEPOSITION HIGH COMPRESSIVE STRESS PECVD OXIDE FILM AFTER IMD CMP PROCESS TO SOLVE MORE THAN 5 METAL STACK VIA PROCESS IMD CRACK ISSUE

BACKGROUND OF THE INVENTION (1) Field of the Invention

The invention relates to the fabrication of integrated circuit devices, and more particularly, to a method for a re-deposition of a high compressive PECVD oxide after IMD CMP to prevent cracks.

(2) Description of the Prior Art

The continuing trend in the semiconductor industry of improving device performance by reducing device feature size has brought with it a continuing increase in device packing density. The continuing decrease of device feature size puts greater emphasis on the art of interconnecting device features and interconnecting devices within multiple device packages. It is therefore not uncommon to see devices that contain a relatively large number of overlaying layers of interconnecting metal lines. As the devices get smaller, however, their performance becomes more heavily dependent on the interconnections between them. Likewise, as the number of devices per chip increases, the area required to route the interconnect lines exceeds the area occupied by the devices. This normally leads to integrated circuit chips with multilevel interconnect schemes.

In the formation of semiconductor integrated circuits, it is common practice to form interconnect metal line structures on a number of different levels within the structure and interconnecting the various levels of wiring with contact or via openings. The first or lowest level of interconnect wires is typically formed as a first step in the process after which a second or overlying level of interconnect wires is deposited over the first level. The first level of interconnect wires is typically in contact with active regions in a semiconductor substrate but is not limited to such contact. The first level of interconnect can for instance also be in contact with a conductor that leads to other devices that form part of a larger, multi-chip structure. The two levels of metal wires are connected by openings between the two layers that are filled with metal where the openings between the two layers are lined up with and match contact points in one or both of the levels of metal lines.

Previously used techniques to form multi-levels of wiring apply the technique of first forming the interconnect level metal in a first plane followed by forming the overlying level of interconnect wire in a second plane. This structure typically starts with the surface of a semiconductor substrate into which active devices have been created. These active devices can include bipolar transistors, MOSFET devices, doped regions that interconnect with other regions of the device while provisions may also have been provided to make interconnects with I/O terminals in the periphery of the device. The surface into which the pattern of interconnect lines of the first plane is formed may also be an insulation layer deposited over the surface of the substrate or a layer of oxide may first have been formed on the surface of the substrate. After the layer, into which the pattern of interconnecting wires has to be created, has been defined, the interconnecting pattern itself needs to be defined. This is done using conventional photolithographic techniques whereby the openings are made (in the layer) above the points that need to be contacted in the substrate. The openings, once created, may by lined with layers of material to enhance metal adhesion (to the sidewalls of the opening), the glue layer, or to prevent diffusion of materials into and from the substrate in subsequent processing steps, the barrier layer. For the barrier layer, a variety of materials can be used such as Ti/Tin:W (titanium/titanium nitride:tungsten), titanium-tungsten/titanium or titanium-tungsten nitride/titanium or titanium nitride or titanium nitride/titanium, silicon nitride ($Si_3N_4$), tungsten, tantalum, niobium, molybdenum. The final phase in creating the first level of interconnect lines is to fill the created openings with metal, typically aluminum, tungsten or copper, dependent on the particular application and requirements and restrictions imposed by such parameters as line width, aspect ratio of the opening, required planarity of the surface of the deposited metal and others.

This process of line formation in overlying layers on metal can be repeated in essentially the same manner as just highlighted for the first layer of interconnecting wires. This process of forming sequential layers of interconnecting levels of wire is in many instances prone to problems and limitations. Copper has in recent times found more application in the use of metal wires due to its low resistivity, high electromigration resistance and stress voiding resistance. Copper however exhibits the disadvantage of high diffusivity in common insulating materials such as silicon dioxide and oxygen-containing polymers. This leads to, for instance, the diffusion of copper into polyimide during high temperature processing of the polyimide resulting in severe erosion of the copper and the polyimide due to the copper combining with oxygen in the polyimide. The erosion may result in loss of adhesion, delamination, voids, and ultimately a catastrophic failure of the component. The copper that is used in an interconnect may diffuse into the silicon dioxide layer causing the dielectric strength to become conductive and also decreasing the dielectric strength of the silicon dioxide layer. A copper diffusion barrier is therefore often required; silicon nitride is often applied as a diffusion barrier to copper. Silicon nitride however has a dielectric constant that is high compared to silicon dioxide thereby limiting the use of silicon nitride in encapsulating copper interconnect lines.

The first interconnection level, which contacts an integrated circuit device, typically contains the most narrow conductor and interconnection elements. Most commonly, first conductor levels have been formed from aluminum metal or aluminum metal alloys. Most commonly, first interconnection levels (i.e. first conductive contact studs) are formed of tungsten. As IC device dimensions have decreased while simultaneously maintaining and increasing demands for performance of the IC's, it has become increasingly important for conductor and interconnection elements within IC's to exhibit a high level of conductivity while simultaneously showing limited susceptibility to degradative phenomenon such as electromigration.

In fabricating a multilayer structure on the substrate to connect integrated circuits to one another, metal power and ground planes in the substrate are typically separated by layers of a dielectric such as a polyimide. A number of high-density semiconductor devices can in this manner be physically and electrically connected to a single substrate. Embedded in other dielectric layers are metal conductor lines with vias (holes) providing electrical connections between signal lines or to the metal power and ground planes. Adjacent layers are ordinarily formed so that the primary signal propagation directions are orthogonal to each other. While the size of aluminum interconnecting lines is of the sub-micron order, currents that flow through Al interconnecting lines are in the order of several hundred microamperes and current density is as high as 105 A/cm². Mechanical stress in the order of 100 MPa is introduced in the interconnecting lines when the semiconductor is subjected to heat treatment in the VLSI manufacturing process.

Current technology frequently uses the application of a thin film of silicon dioxide over a surface thereby reducing potential damage to the surface. This thin film is created using Chemical Vapor Deposition (CVD) techniques whereby typically ozone-TEOS chemistry is used immediately followed by PECVD deposition of the silicon dioxide film. The CVD process has the disadvantage that it requires high temperatures, these high temperatures can damage the molecular structure of metal layers within the device. For this reason, Plasma Enhanced CVD (PECVD) is frequently used whereby the applied rf energy causes disassociation of the reactant gasses to a reaction zone close to the surface that is treated thereby creating a plasma of highly reactive ions. This reduces the energy that is required for a chemical reaction to take place and, as a consequence, the processing temperature required for the CVD process can be reduced. This makes the PECVD process of value for (for instance) the deposition of layers of insulation or dielectric over the surface of deposited layers of metal.

Where increased insulation is required, the Sub-Atmospheric CVD (SACVD) process is frequently used since this process (partly due to its slow deposition rate) allows good filling of gaps and spaces between metal lines. A typical SACVD process uses a temperature range of between 350 and 500 degrees C. with a pressure between about 20 and 700 torr. Because the PECVD deposition rate is relatively high, an insulation layer of considerable thickness is typically created by first forming the layer of PECVD over which the layer of SACVD is formed completing the required thickness of the insulation layer.

In the semiconductor industry, a body of work has been performed that relates to the formation of insulating and passivation layers whereby the choice of materials used, the sequence in which these layers are deposited and the particular processing conditions under which the layers are created are the parameters of choice in establishing the relative success of these processes. Efforts have for instance been invested in first creating a layer of SACVD over which a layer of PECVD is created. This process resulted in a layer that, when etched to create the pattern for the metal interconnect lines, results in a lateral etch into the relatively poor interface between the two layers resulting in an undesirable metal profile and, ultimately, reliability problems with the created metal lines.

FIG. 1 shows a Prior Art three metal level structure wherein 16, 20 and 24 form the first, second and third level of metal respectively. The plugs 18 and 22 connect the metal levels together while plug 14 connects the first level of metal 16 with the contact plug 26 that has been provided in the surface of the semiconductor substrate 10. Layers 12, 13 and 15 of dielectric separate the respective layers of metal. In the cross section that is shown in FIG. 1, the layer 12 of dielectric is referred to as the Intra Level Dielectric (ILD) while the layers 13 and 15 of dielectric are referred to as the Inter Metal Dielectric (IMD). The top layer 19 is typically an insulator and is deposited for protection of the semiconductor device from environmental damage during subsequent steps of device processing or packaging, this layer can for instance contain polyimide and is typically deposited to a thickness of several thousands of Angstrom. Layer 19 is patterned and etched to create an opening (not shown) in the layer 19, this opening aligns with the top metal pad 24. Electrical contact to the device and the underlying layers of metal is then established through this opening.

In creating a structure of a relatively large number of levels of metal, problems of planarity, adhesion, metal diffusion and others that have previously been highlighted can become particularly acute due to the very nature of the structure that is shown in FIG. 1. It is not uncommon to extend the number of metal layers in such a stack to 5 or more, this to meet the increased demands of device packaging density. The decrease in feature size that is also common for sub-micron devices further makes the creation of a large interconnect metal stack particularly challenging. The currently used 0.25 um design rule makes filling the gaps between created metal lines a critical issue. In creating a layer of IMD, a layer of PETEOS is frequently used that overlays a layer of SACVD, the two layers form one layer of IMD. It is critical for this layer of IMD that good adhesion is obtained along the surfaces where these two layers of PETEOS and SACVD make contact. Any lack of adhesion will ultimately result in peeling and reliability problems. A low stress interface between the two layers is therefore required. The invention addresses these problems of deposition of layers of IMD in the creation of a metal stack that has a large number of layers.

SUMMARY OF THE INVENTION

A principle objective of the invention is to provide a method for forming a layer of Inter Metal Dielectric for high metal stack interconnect layers.

Another objective of the invention is to prevent stress between successive layers of dielectric that are deposited for the formation of Inter Metal Dielectrics for high metal stack interconnect layers.

Yet another objective of the invention is to promote adhesion between successive layers of dielectric that are deposited for the formation of Inter Metal Dielectrics for high metal stack interconnect layers In accordance with the objectives of the invention a new method is provided for the creation of layers of dielectric that are used for metal stack interconnect layers where the metal stack exceeds five layers. A stack of five layers of metal interconnect lines contains one layer of Intra Metal dielectric (ILD) and four layers of Inter Metal dielectric (IMD). One or more of the layers of IMD can be formed in the conventional method. One or more of the layers of IMD can be formed in the conventional method after which a layer of high compressive PECVD is deposited over this one or more layers of IMD. The layer of high compressive PECVD provides a crack resistant film that eliminates the formation of cracks in the surface of the IMD.

BRIEF DESCRIPTION OF THE DRAWINGS

FIG. 1 shows a cross section of a Prior Art three layer stack of interconnect metal.

FIG. 2 shows a cross section of a gate electrode structure with an overlying dielectric layer of SACVD/PETEOS.

DESCRIPTION OF THE PREFERRED EMBODIMENTS

Figure 3:
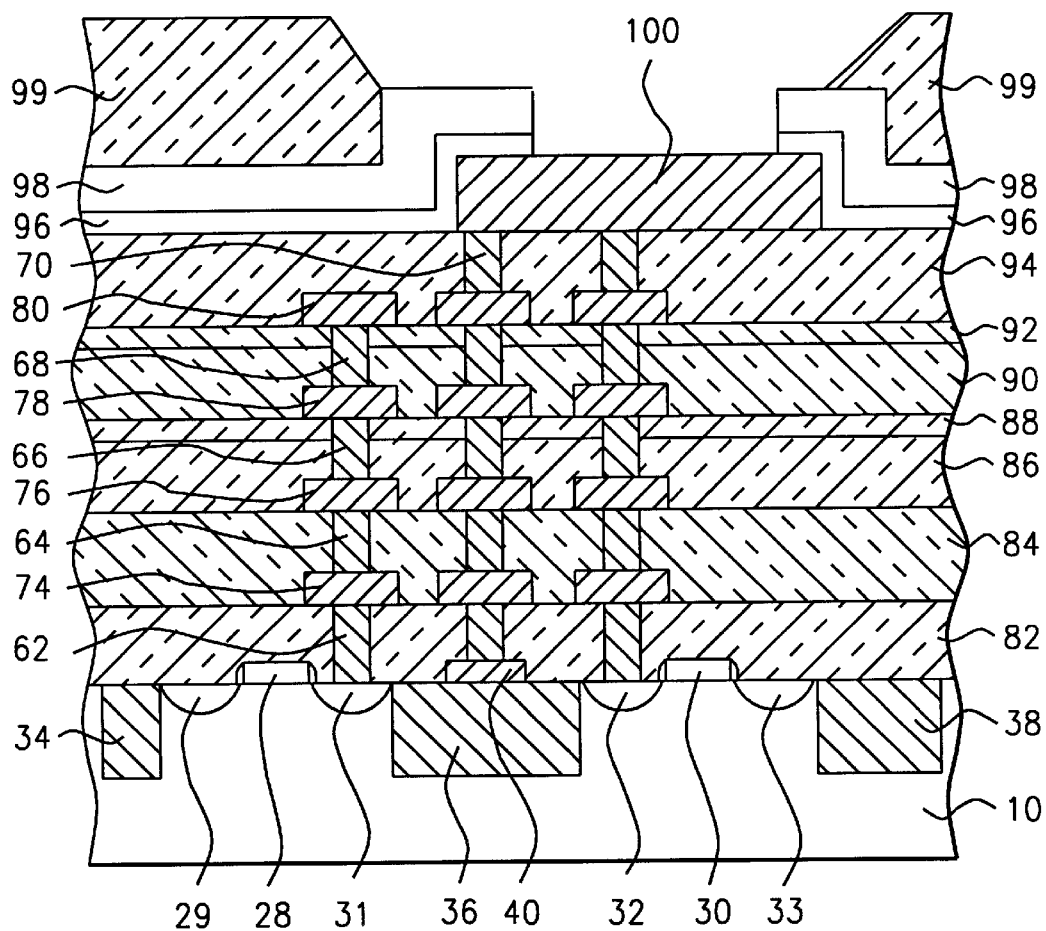
FIG. 3 shows a cross section of a five-layer stack of interconnect metal of the invention.

Recent sub-minia turization of the semiconductor industry has led to device feature sizes in the 0.25 um range. Multi level interconnect schemes, of which FIG. 1 is an example, are frequently applied whereby the layer of Inter Metal Dielectric (layers 13 and 15, FIG. 1) is formed by depositing a layer of SACVD oxide (deposited to a thickness of between 3,000 and 5,000 Angstrom) over which a layer of PETEOS is deposited (deposited to a thickness of between 17,000 and 19,000 Angstrom) after which the layer of IMD is polished using CMP to a thickness of between about 9,000 and 11,000 Angstrom. The indicated process results in a separation or seam on the surface of the SACVD layer caused by inadequate gap fill for 0.25 um line spacing. Measurements have further indicated that the interface between the SACVD and the PECVD layer have regions of high stress combined with low adhesion between the two layers. Scanning Electron Microscopic (SEM) analysis of the interface between the SACVD and the PECVD layers revealed mechanical separation or cracking that occurs between these two interfaces, this separation is particularly noticeable in the regions of the vias within the stack. The invention teaches a method of forming the Inter Metal Dielectric that eliminates the observed phenomenon of layer separation and crack formation.

FIG. 2 shows an example of the above-indicated depositions of PETEOS and SACVD. The depositions shown are for a semiconductor device where two MOS gate electrodes have been formed on the surface of a substrate 10. The polarity of the two gate electrodes and the source/drain regions for the gate electrodes have not been indicated since these parameters are not of importance to the discussion at hand. Highlighted are the semiconductor substrate 10 on the surface of which have been created the two gate electrodes 40 and 42 of AlCu that are separated from the substrate 10 by a stress relieve layer 44 of TiN. The top surface of the gate electrodes 40 and 42 has been coated with a layer 46 of Anti Reflective Coating (ARC), a layer 48 of PEOX has been deposited over the gate electrodes to form the isolation regions (gates) of the electrodes. A layer 50 of SACVD has been deposited over the structure over which a layer 52 of TEOS ahs been deposited. Layer 54 of TiN forms an etch stop layer for the metal etch, layer 56 of AlCu forms the metal layer that is used to form the interconnect wires overlying the gate electrodes. Of interest to the invention are the two layers 50 (of SACVD) and 52 (of TEOS). These two layers combined form the IMD for the structure, the invention provides a method whereby the IMD is improved by depositing an additional layer (of compressive PECVD) over the top layer of TEOS after the combined layers of SACVD and TEOS have been polished.

It is clear from FIG. 2 that electrical contacts are established with the regions of interest (the source/drain regions of the gate electrodes and the top surface of the gate electrodes) by patterning and etching openings though layers 54, 52 and 50 thereby reaching these (frequently salicided to provide lower sheet resistance of the contact areas) regions of electrical contact. These processing steps have also not been highlighted in FIG. 2 since they too are not of interest to the invention. The example as shown in FIG. 2 is highlighted for reasons of applicability of the invention and as an example where the invention can typically provide a significant improvement in the creation of layers of IMD. Although only one layer of IMD has been indicated in FIG. 2, the layers of IMD can readily be increased dependent on and determined by overall device packaging density and requirements.

Referring now specifically to FIG. 3, there is shown a cross section of a five layer stack of interconnect metal of the invention that is formed on the surface of a semiconductor substrate 10. The cross section of FIG. 3 shows, as an example of the application of the invention, a cross section of two gate electrodes 28 and 30 with the source (29) and drain (31) regions of gate electrode 28 and the source (32) and drain (33) regions of gate electrode 30. Regions 34, 36 and 38 are Shallow Trench Isolation (STI) regions, the levels of metal contacts that are shown in FIG. 3 establish contact with the drain region 31 of the gate electrode 28, the STI region 36 and the source region 32 of the gate electrode 30. Region 40 forms an electrical contact pad that has been formed over the STI region 36 and that is in electrical contact with this STI region 36.

Because of the large numbers of layers that are shown in FIG. 3, these layers are hereby described, as follows:
 layer 82 is the layer of Inter Level Dielectric (ILD)
 layers 84, 86/88, 90/92 and 94 are the layers of Inter Metal Dielectric (IMD) whereby 84 is the first level of IMD, 86/88 is the second level of IMD, 90/92 is the third level of IMD and 94 is the fourth level of IMD
 columns 62 are the plugs through the layer of ILD that connect the points of contact (31, 32, 40) on the surface of substrate 10 with the first metal level 74
 pads 74, 76, 78 and 80 form the contact pads of respectively the first, second, third and fourth levels of metal
 columns 64, 66, 68 and 70 are the plugs that connect the underlying pad to the next higher level of metal, for instance columns 64 are plugs formed in the first level of IMD (84) that connect pads 74 with pads 76 in the second level of IMD (86)
 metal pad 100 is the fifth and, in the example shown in FIG. 3, the final layer of metal.

Special mention must be made of layers 86 and 88 where layer 86 is the layer of IMD that has been formed in the conventional method (a layer of SACVD over which a layer of PETEOS is deposited) while layer 88 is the layer of compressive PECVD of the invention. The layers 86 and 88 together form one layer of IMD, that is the second layer (level) of IMD. The same must be observed with respect to layers 90 and 92, that is layer 90 is the layer of IMD that has been formed in the conventional method (a layer of SACVD over which a layer of PETEOS is deposited) while layer 92 is the layer of compressive PECVD of the invention. The layers 90 and 92 together form one layer of IMD, that is the third layer (level) of IMD.

Over the final layer of metal (pad 100) an etch stop layer 96 has been deposited with a passivation layer 98, the completed structure is protected from environmental damage by the heavy layer 99 of polyimide. It is clear that an opening has been etched in the layers 96, 98, and 99 in order to expose the top surface of the metal pad 100 so that electrical contact can be established with the layers of metal of the structure.

The material that can be used for the formation of the layer 82 of the Intra Level Dielectric can contain a typical semiconductor dielectric material such as silicon dioxide ("oxide", doped or undoped) or silicon nitride ("nitride"), silicon oxynitride, fluoropolymer, parylene, polyimide, tetraethyl-ortho-silicate (TEOS) based oxides, boro-phosphatesilicate-glass (BPSG), phospho-silicate-glass (PSG), bor-osilicate-glass (BSG), oxide-nitride-oxide (ONO), tantalum pentoxide ($Ta_2O_5$), plasma enhanced silicon nitride (PSiNx), titanium oxide, oxynitride.

The dielectric that is used for layer 82 preferably contains silicon dioxide (doped or undoped), silicon oxynitride, parylene or polyimide, spin-on-glass, plasma oxide or LPCVD oxide. The dielectric layer 82 can be deposited using either LPCVD, PECVD, or APCVD processing, at a temperature between about 400 to 800 degrees C. to a thickness between about 5000 to 10000 Angstrom.

The material that is used for the various layers of Inter Metal Dielectric have in already been identified, that is the layers 84, 86, 90 and 94 comprise a layer of SACVD oxide over which a layer of PETEOS is deposited.

The layer of SACVD is typically deposited using a temperature range of between 350 and 500 degrees C. with a pressure between about 20 and 700 torr and is deposited to a thickness of between 3 and 5 KAngstrom.

Typical temperatures for PETEOS deposition are 350 to 450 degrees C. with a pressure of between about 2.0 and 2.8 Torr for the duration between about 8 and 12 seconds. The layer of PETEOS is typically deposited to a thickness of between 17 and 19 KAngstrom.

Of special consideration for the example shown in FIG. 3 are the IMD layers 86/88 and 90/92 since these layers have been created by first depositing the layers of SACVD oxide and PETEOS after which these layers are further exposed to the deposition of a high compressive stress PECVD oxide film. This film is typically deposited to a thickness of between about 2 and 4 KAngstrom. This film, when deposited as indicated, resolves the problems of via cracking in metal stacks that contain a large number of layers of metal, typically five layer of metal. The preferred conditions for this film deposition are as follows: temperature between about 350 and 450 degrees C., pressure of between about 5 and 8 Torr, a TEOS flow rate of between 800 and 1200 sccm, source: oxide, time of deposition between about 200 and 300 seconds, $O_2$ gas flow rate between about 2000 and 2700 sccm.

Typical etch procedures for the etching of dielectrics use anisotropic, RIE processing, using $CHF_3$ as an etchant.

Passivation layer 98 can contain silicon oxide/silicon nitride ($SiO_2/SiO_4$) deposited by CVD. Another material often used for passivation layer is phosphorous doped silicon dioxide that is typically deposited over a final layer of aluminum interconnect using a Low Temperature CVD process.

Passivation layer 98 can be deposited using PECVD technology at a temperature between about 350 and 450 degrees C. with a pressure of between about 2.0 and 2.8 Torr for the duration between about 8 and 12 seconds.

Etching of the passivation layer 98 can use $Ar/CF_4$ as an etchant using a commercially available parallel plate RIE etcher or an Electron Cyclotron Resonance (ECR) plasma reactor at a temperature of between about 120 and 160 degrees C. and a pressure of between about 0.30 and 0.40 Torr for a time of between about 33 and 39 seconds using a dry etch process.

The process of depositing and patterning polyimide is relatively simple and is well understood in the art. polyimide is typically spun on in the form of a liquid (polyamic-acid precursor). After spin-on, the polyimide may be cured whereby the spun-on polyimide becomes a solid polyimide film. Etching of the cured film often uses oxygen or fluorine based plasma. Polyimide is typically applied over the entire substrate followed by a baking step to cure and evaporate the solvents in the polyimide.

Polyimide provides extra protection to the surface of the silicon chip against scratching, cracking and other types of mechanical damage. Most often, mechanical damage occurs during assembly, packaging or any subsequent handling of the die. As a passivation layer, polyimide also guards against thin film cracking which frequently results from the packaging of very large dies into plastic packages.

Existing polyimide processes are compatible with standard forms of wire bonding technology. Normal defects, such as cracks or flakes, which arise from the interaction of the polyimide with photoresist, do not normally pose a problem for this standard bonding technology.

However, as newer forms of bonding technology come into use, such as tape automated bonding (TAB) which utilizes gold bumps formed on the bonding pads of the semiconductor substrate, polyimide processes still present problems. Bonding pad edges are for instance required to be consistent in order to allow for proper bonding operations. Rough edges or films having numerous flakes and other defects also present a problem. These shortcomings may be more acute when using the newer, more advanced bonding techniques such as TAB compatible gold bump bonding. adhere properly to the polyimide surface.

Curing of the polyimide provides extra protection to the device circuitry. This step is typically a high temperature cure, at 350 to 400 degrees C., in a $N_2$ gas ambient for a time period between about 1.5 and 2.5 hours.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications which fall within the scope of the appended claims and equivalents thereof.

What is claimed is:

1. A method of forming a large metal stack over the surface of a semiconductor substrate, comprising the steps of:

providing a semiconductor substrate whereby the surface of said substrate contains one or more points of electrical contact;

creating a first level of metal over the surface of said substrate, said first layer of metal comprising a layer of Intra Level Dielectric (ILD);

creating a second level of metal over the surface of said first level of metal, said second level of metal comprising a first layer of Inter Metal dielectric (IMD);

creating a third level of metal over the surface of said second level of metal, said third level of metal comprising a second layer of Inter Metal dielectric (IMD), said second layer of IMD comprising a lower layer of SACVD over which a layer of PETEOS is deposited over which a first layer of high-compressive PECVD is deposited forming an upper layer of said second layer of IMD;

creating a fourth level of metal over the surface of said third level of metal, said fourth level of metal comprising a third layer of Inter Metal dielectric (IMD), said third layer of IMD comprising a lower layer of SACVD over which a layer of PETEOS is deposited over which a second layer of high-compressive PECVD is deposited forming an upper layer of said third layer of IMD;

creating a fifth level of metal over the surface of said fourth level of metal, said fifth level of metal comprising a fourth layer of Inter Metal dielectric (IMD);

depositing an etch stop layer over the surface of said fourth layer of Inter Metal dielectric (IMD), thereby including the surface of said fifth level of metal;

depositing a passivation layer over the surface of said etch stop layer;

depositing a insulation layer over the surface of said passivation layer; and patterning and etching said insulation, passivation and etch stop layer thereby creating an opening for access to said fifth level of metal.

2. The method of claim 1 wherein said creating a first level of metal over the surface of said substrate is:

depositing a layer of Intra Level Dielectric over the surface of said substrate thereby including said one or more points of electrical contact on the surface of said substrate; patterning and etching said layer of Intra Level Dielectric whereby said pattern overlays and aligns with said one or more points of electrical contact on the surface of said substrate thereby creating contact openings in said layer of ILD; depositing a first layer of metal over the surface of said layer of ILD thereby including said contact openings in said layer of ILD;

planarizing the surface of said deposited layer of metal; and patterning and etching said layer of metal thereby creating metal pads of the first layer of metal said metal pads overlying said layer of ILD said metal pads furthermore being aligned with said contact openings in said layer of ILD.

3. The method of claim 1 wherein said creating a second level of metal over the surface of said first level of metal is:

depositing a first layer of SACVD over the surface of said layer of ILD thereby including said metal pads of the first layer of metal;

depositing a first layer of PETEOS over said first layer of SACVD whereby said first layer of SACVD and said first layer of PETEOS form the first layer of IMD;

patterning and etching said first layer of IMD whereby said pattern overlays and aligns with said metal pads of the first layer of metal thereby creating contact openings in said first layer of IMD;

depositing a second layer of metal over the surface of said first layer of IMD thereby including said contact openings in said first layer of IMD; planarizing the surface of said deposited second layer of metal; and patterning and etching said second layer of metal thereby creating metal pads of the second layer of metal said metal pads overlying said first layer of IMD said metal pads furthermore being aligned with said contact openings in said first layer of IMD.

4. The method of claim 3 wherein said depositing a first layer of SACVD uses a deposition temperature range of between 350 and 500 degrees C. with a pressure between about 20 and 700 torr whereby said layer is deposited to a thickness of between 3 and 5 KAngstrom.

5. The method of claim 3 wherein said depositing a first layer of PETEOS uses a temperature between about 350 and 450 degrees C. with a pressure of between about 2.0 and 2.8 Torr for the duration between about 8 and 12 seconds said layer of PETEOS deposited to a thickness of between 17 and 19 KAngstrom.

6. The method of claim 1 wherein said creating a third level of metal over the surface of said second level of metal is:

depositing a second layer of SACVD over the surface of said first layer of IMD thereby including said metal pads of the second layer of metal;

depositing a second layer of PETEOS over said second layer of SACVD;

depositing a layer of high compressive stress PECVD oxide over said second layer of PETEOS whereby said second layer of SACVD and said second layer of PETEOS and said layer of high compressive stress PECVD oxide form the second layer of IMD;

patterning and etching said second layer of IMD whereby said pattern overlays and aligns with said metal pads of the second layer of metal thereby creating contact openings in said second layer of IMD;

depositing a third layer of metal over the surface of said second layer of IMD thereby including said contact openings in said second layer of IMD;

planarizing the surface of said deposited third layer of metal; and patterning and etching said third layer of metal thereby creating metal pads of the third layer of metal said metal pads overlying said second layer of IMD said metal pads furthermore being aligned with said contact openings in said second layer of IMD.

7. The method of claim 6 wherein said depositing a second layer of SACVD uses a deposition temperature range of between 350 and 500 degrees C. with a pressure between about 20 and 700 torr whereby said layer is deposited to a thickness of between 3 and 5 KAngstrom.

8. The method of claim 6 wherein said depositing a second layer of PETEOS uses a temperature between about 350 and 450 degrees C. with a pressure of between about 2.0 and 2.8 Torr for the duration between about 8 and 12 seconds said layer of PETEOS deposited to a thickness of between 17 and 19 KAngstrom.

9. The method of claim 1 wherein said creating a fourth level of metal over the surface of said second level of metal is:

depositing a third layer of SACVD over the surface of said second layer of IMD thereby including said metal pads of the third layer of metal;

depositing a third layer of PETEOS over said third layer of SACVD;

depositing a second layer of high compressive stress PECVD oxide over said third layer of PETEOS whereby said third layer of SACVD and said third layer of PETEOS and said second layer of high compressive stress PECVD oxide form the third layer of IMD;

patterning and etching said third layer of IMD whereby said pattern overlays and aligns with said metal pads of the third layer of metal thereby creating contact openings in said third layer of IMD;

depositing a fourth layer of metal over the surface of said third layer of IMD thereby including said contact openings in said third layer of IMD; planarizing the surface of said deposited fourth layer of metal; and patterning and etching said fourth layer of metal thereby creating metal pads of the fourth layer of metal said metal pads overlying said third layer of IMD said metal pads furthermore being aligned with said contact openings in said third layer of IMD.

10. The method of claim 9 wherein said depositing a third layer of SACVD uses a deposition temperature range of between 350 and 500 degrees C. with a pressure between about 20 and 700 torr whereby said layer is deposited to a thickness of between 3 and 5 KAngstrom.

11. The method of claim 9 wherein said depositing a third layer of PETEOS uses a temperature between about 350 and 450 degrees C. with a pressure of between about 2.0 and 2.8 Torr for the duration between about 8 and 12 seconds said layer of PETEOS deposited to a thickness of between 17 and 19 KAngstrom.

12. The method of claim 1 wherein said creating a creating a fifth level of metal over the surface of said fourth level of metal is:

depositing a fourth layer of SACVD over the surface of said third layer of IMD thereby including said metal pads of the fourth layer of metal;

depositing a fourth layer of PETEOS over said fourth layer of SACVD thereby completing the fourth layer of IMD whereby said fourth layer of SACVD and said fourth layer of PETEOS form the fourth layer of IMD;

patterning and etching said fourth layer of IMD whereby said pattern overlays and aligns with said metal pads of the fourth layer of metal thereby creating contact openings in said fourth layer of IMD;

depositing a fifth layer of metal over the surface of said fourth layer of IMD thereby including said contact openings in said fourth layer of IMD; planarizing the surface of said deposited fifth layer of metal; and patterning and etching said fifth layer of metal thereby creating metal pads of the fifth layer of metal said metal pads overlying said fourth layer of IMD said metal pads furthermore being aligned with said contact openings in said fourth layer of IMD.

13. The method of claim 12 wherein said depositing a fourth layer of SACVD uses a deposition temperature range of between 350 and 500 degrees C. with a pressure between about 20 and 700 torr whereby said layer is deposited to a thickness of between 3 and 5 KAngstrom.

14. The method of claim 12 wherein said depositing a fourth layer of PETEOS uses a temperature between about 350 and 450 degrees C. with a pressure of between about 2.0 and 2.8 Torr for the duration between about 8 and 12 seconds said layer of PETEOS deposited to a thickness of between 17 and 19 KAngstrom.

15. The method of claim 1 wherein said depositing an etch stop layer over the surface of said fifth level of metal is depositing a layer of silicon nitride deposited to a thickness of between about 200 and 400 Angstrom using CVD processes.

16. The method of claim 1 wherein said depositing a passivation layer over the surface of said etch stop layer is depositing silicon oxide/silicon nitride ($SiO_2/Si_3N_4$) deposited by CVD to a thickness between about 300 and 800 Angstrom at a temperature between about 400 and 600 degrees C. with a pressure of between about 1.0 and 2.0 Torr for the duration between about 8 and 12 seconds.

17. The method of claim 1 wherein said depositing a passivation layer over the surface of said etch stop layer is depositing phosphorous doped silicon dioxide to a thickness between about 300 and 800 Angstrom using Low Temperature PECVD processes at a temperature between about 350 and 450 degrees C. with a pressure of between about 2.0 and 2.8 Torr for the duration between about 8 and 12 seconds.

18. The method of claim 1 with the additional step of curing said polyimide at temperature cure between about 350 and 400 degrees C. in a $N_2$ gas ambient for a time period between about 1.5 and 2.5 hours.

19. The method of claim 1 whereby this method is extended by depositing additional layers of IMD said extension to be applied prior to the formation of the fifth layer of metal whereby the creation of each additional layer of IMD comprises the steps of:

depositing a layer of SACVD over the surface of the underlying layer of IMD thereby including said metal pads of the underlying layer of metal;

depositing a layer of PETEOS over said layer of SACVD; depositing a layer of high compressive stress PECVD oxide over said layer of PETEOS whereby said layer of SACVD and said layer of PETEOS and said layer of high compressive stress PECVD oxide complete the layer of IMD;

patterning and etching said layer of IMD whereby said pattern overlays and aligns with said metal pads of the underlying layer of metal thereby creating contact openings in said layer of IMD;

depositing a layer of metal over the surface of said layer of IMD thereby including said contact openings in said layer of IMD;

planarizing the surface of said deposited layer of metal; and patterning and etching said layer of metal thereby creating metal pads of the overlying layer of metal said metal pads overlying said layer of IMD said metal pads furthermore being aligned with said contact openings in said layer of IMD.

20. The method of claim 19 wherein said depositing a layer of SACVD uses a deposition temperature range of between 350 and 500 degrees C. with a pressure between about 20 and 700 torr whereby said layer is deposited to a thickness of between 3 and 5 KAngstrom.

21. The method of claim 19 wherein said depositing a layer of PETEOS uses a temperature between about 350 and 450 degrees C. with a pressure of between about 2.0 and 2.8 Torr for the duration between about 8 and 12 seconds said layer of PETEOS deposited to a thickness of between 17 and 19 KAngstrom.

* * * * *